(12) United States Patent
Inamura et al.

(10) Patent No.: US 12,230,771 B2
(45) Date of Patent: Feb. 18, 2025

(54) POWER STORAGE MODULE AND METHOD OF MANUFACTURING SAME

(71) Applicant: Prime Planet Energy & Solutions, Inc., Tokyo (JP)

(72) Inventors: Takashi Inamura, Himeji (JP); Yasumasa Kojima, Kasai (JP); Takatoshi Kageyama, Kakogawa (JP)

(73) Assignee: PRIME PLANET ENERGY & SOLUTIONS, INC., Tokyo (JP)

( * ) Notice: Subject to any disclaimer, the term of this patent is extended or adjusted under 35 U.S.C. 154(b) by 548 days.

(21) Appl. No.: 17/553,571

(22) Filed: Dec. 16, 2021

(65) Prior Publication Data

US 2022/0200065 A1 Jun. 23, 2022

(30) Foreign Application Priority Data

Dec. 21, 2020 (JP) .................................. 2020-211178

(51) Int. Cl.
*H01M 10/42* (2006.01)
*H01G 4/38* (2006.01)
*H05K 1/02* (2006.01)

(52) U.S. Cl.
CPC ............ *H01M 10/425* (2013.01); *H01G 4/38* (2013.01); *H05K 1/028* (2013.01); *H05K 2201/10015* (2013.01); *H05K 2201/10037* (2013.01)

(58) Field of Classification Search
CPC ............ H01M 10/425; H01M 50/209; H01M 50/238; H01M 50/284; H01M 50/519; H05K 1/028; H05K 1/0281; H05K 1/189; H05K 2201/10015; H05K 2201/10037; H05K 2201/10189; H05K 2201/10272; Y02E 60/10
See application file for complete search history.

(56) References Cited

U.S. PATENT DOCUMENTS

| | | |
|---|---|---|
| 2008/0233475 A1 | 9/2008 | Kozu et al. |
| 2010/0092859 A1 | 4/2010 | Kim et al. |
| 2011/0195284 A1 | 8/2011 | Yasui et al. |
| 2018/0198110 A1 | 7/2018 | Zeng |
| 2019/0027731 A1 | 1/2019 | Zeng et al. |
| 2019/0386282 A1 | 12/2019 | Nakayama et al. |
| 2022/0021083 A1 | 1/2022 | Takahashi et al. |

FOREIGN PATENT DOCUMENTS

| | | |
|---|---|---|
| CN | 1898819 A | 1/2007 |
| CN | 101728580 A | 6/2010 |
| CN | 102246330 A | 11/2011 |

(Continued)

*Primary Examiner* — Victoria H Lynch
(74) *Attorney, Agent, or Firm* — HAUPTMAN HAM, LLP

(57) ABSTRACT

A power storage module includes: a stack in which a plurality of power storage cells are stacked in a stacking direction; a resin plate having a bottom surface portion and placed on the stack of the plurality of power storage cells; a flexible printed circuit board placed on the bottom surface portion of the resin plate and having an electric circuit electrically connected to the plurality of power storage cells; a connector for the electric circuit, the connector being fixed to the flexible printed circuit board; and a substrate that supports the flexible printed circuit board and the connector, the substrate being fixed to the resin plate with the substrate being positioned in an extending direction of the bottom surface portion of the resin plate.

16 Claims, 6 Drawing Sheets

(56) References Cited

FOREIGN PATENT DOCUMENTS

| | | |
|---|---|---|
| CN | 108289372 A | 7/2018 |
| CN | 110366788 A | 10/2019 |
| JP | 201393307 A | 5/2013 |
| JP | 2018-113438 A | 7/2018 |
| JP | 2019-23996 A | 2/2019 |
| JP | 2019-135687 A | 8/2019 |
| JP | 2020-87666 A | 6/2020 |
| JP | 2021-68696 A | 4/2021 |

POWER STORAGE MODULE AND METHOD OF MANUFACTURING SAME

This nonprovisional application is based on Japanese Patent Application No. 2020-211178 filed on Dec. 21, 2020, with the Japan Patent Office, the entire contents of which are hereby incorporated by reference.

BACKGROUND OF THE INVENTION

Field of the Invention

The present technology relates to a power storage module and a method of manufacturing the power storage module.

Description of the Background Art

A wiring module, which employs a flexible printed circuit board, for a power storage device has been conventionally known. For example, Japanese Patent Laying-Open No. 2013-93307 (PTL 1) discloses a wiring module for a battery, wherein a collective conductive wire path is formed by a flexible printed circuit board.

In the wiring module described in PTL 1, it is important to precisely position the flexible print substrate and precisely position an electric-wire-side connector to be fitted in a device-side connector. However, the conventional wiring module does not necessarily include a sufficient configuration in view of the above.

SUMMARY OF THE INVENTION

An object of the present technology is to provide a power storage module in which a flexible printed circuit board and a connector connected to the flexible printed circuit board are precisely positioned.

A power storage module according to the present technology includes: a stack in which a plurality of power storage cells are stacked in a stacking direction; a resin plate having a bottom surface portion and placed on the stack of the plurality of power storage cells; a flexible printed circuit board placed on the bottom surface portion of the resin plate and having an electric circuit electrically connected to the plurality of power storage cells; a connector for the electric circuit, the connector being fixed to the flexible printed circuit board; and a substrate that supports the flexible printed circuit board and the connector, the substrate being fixed to the resin plate with the substrate being positioned in an extending direction of the bottom surface portion of the resin plate.

A method of manufacturing a power storage module according to the present technology includes: forming a stack by stacking a plurality of power storage cells in a stacking direction; placing a resin plate on the stack of the plurality of power storage cells, the resin plate having a bottom surface portion; and placing a wiring member on the bottom surface portion of the resin plate, the wiring member including a flexible printed circuit board having an electric circuit. The placing of the wiring member on the bottom surface portion of the resin plate includes: fixing, to the flexible printed circuit board, a connector for the electric circuit; assembling a substrate to the flexible printed circuit board and the connector; and fixing the substrate to the resin plate with the substrate being positioned in an extending direction of the bottom surface portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
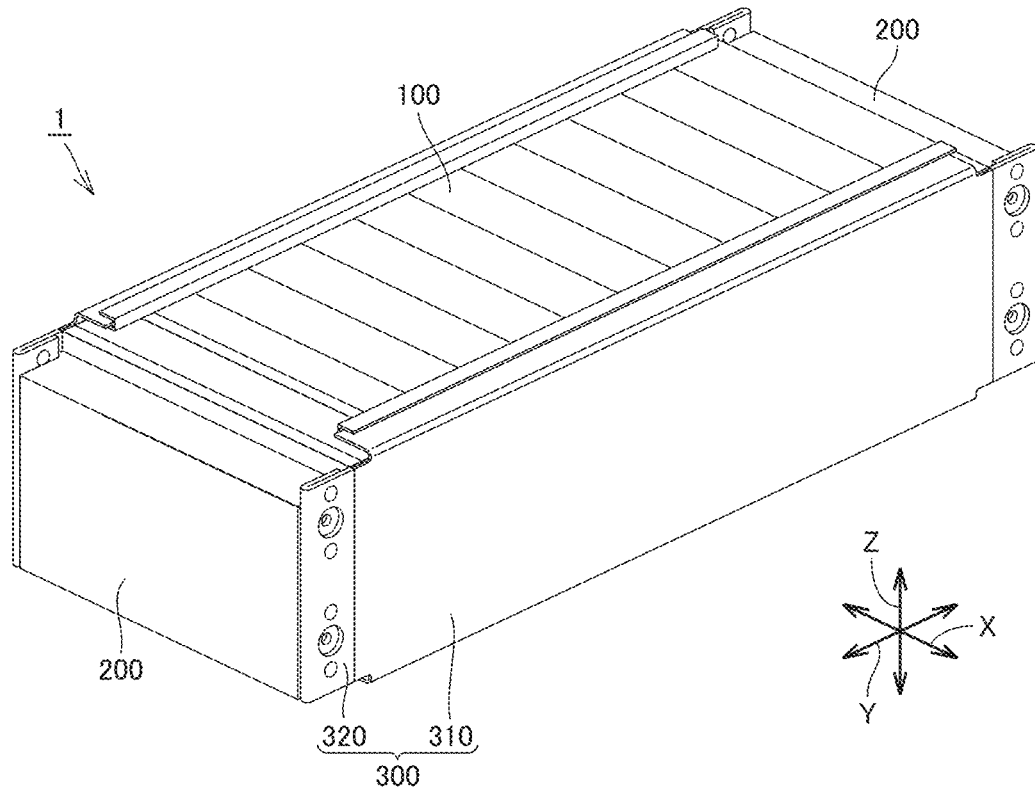
FIG. 1 is a diagram showing a basic configuration of a battery pack.

Hereinafter, embodiments of the present technology will be described. It should be noted that the same or corresponding portions are denoted by the same reference characters, and may not be described repeatedly.

It should be noted that in the embodiments described below, when reference is made to number, amount, and the like, the scope of the present technology is not necessarily limited to the number, amount, and the like unless otherwise stated particularly. Further, in the embodiments described below, each component is not necessarily essential to the present technology unless otherwise stated particularly.

It should be noted that in the present specification, the terms "comprise", "include", and "have" are open-end terms. That is, when a certain configuration is included, a configuration other than the foregoing configuration may or may not be included. Further, the present technology is not limited to one that necessarily exhibits all the functions and effects stated in the present embodiment.

In the present specification, the term "battery" is not limited to a lithium ion battery, and may include another battery such as a nickel-metal hydride battery. In the present specification, the term "electrode" may collectively represent a positive electrode and a negative electrode. Further, the term "electrode plate" may collectively represent a positive electrode plate and a negative electrode plate.

In the present specification, the "power storage cell" or the "power storage module" is not limited to a battery cell or a battery module, and may include a capacitor cell or a capacitor module.

Figure 2:
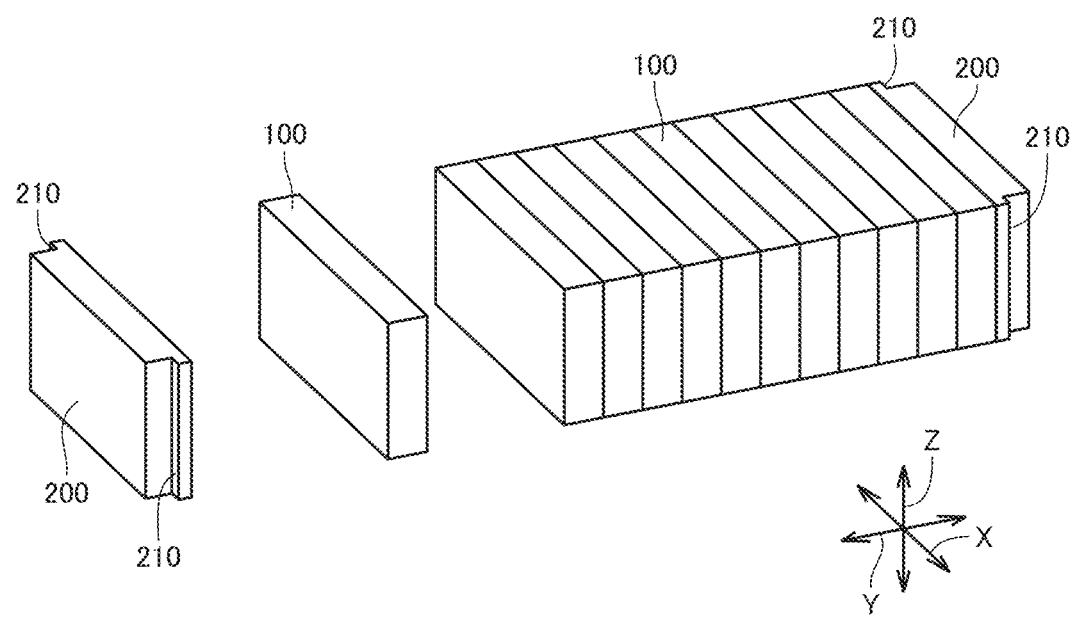
FIG. 2 is a diagram showing battery cells and end plates in the battery pack shown in FIG. 1.

FIG. 1 is a diagram showing a basic configuration of a battery pack 1. FIG. 2 is a diagram showing battery cells 100 and end plates 200 included in battery pack 1.

As shown in FIGS. 1 and 2, battery pack 1, which serves as an exemplary "power storage module", includes battery cells 100, end plates 200, and a restraint member 300.

The plurality of battery cells 100 are provided side by side in a Y axis direction (arrangement direction). Thus, a stack of battery cells 100 is formed. Each of battery cells 100 includes an electrode terminal 110. A separator (not shown) is interposed between the plurality of battery cells 100. The plurality of battery cells 100, which are sandwiched between two end plates 200, are pressed by end plates 200, and are therefore restrained between two end plates 200.

End plates 200 are disposed beside both ends of battery pack 1 in the Y axis direction. Each of end plates 200 is fixed to a base such as a case that accommodates battery pack 1. Stepped portions 210 are formed at both ends of end plate 200 in an X axis direction.

Restraint member 300 connects two end plates 200 to each other. Restraint member 300 is attached to stepped portions 210 formed on two end plates 200.

Restraint member 300 is engaged with end plates 200 with compression force in the Y axis direction being exerted to the stack of the plurality of battery cells 100 and end plates 200, and then the compression force is released, with the result that tensile force acts on restraint member 300 that connects two end plates 200 to each other. As a reaction thereto, restraint member 300 presses two end plates 200 in directions of bringing them closer to each other.

Restraint member 300 includes a first member 310 and a second member 320. First member 310 and second member 320 are coupled to each other by butt welding, for example. Tip surfaces formed by folding second member 320 are brought into abutment with stepped portions 210 of end plate 200 in the Y axis direction.

Figure 3:
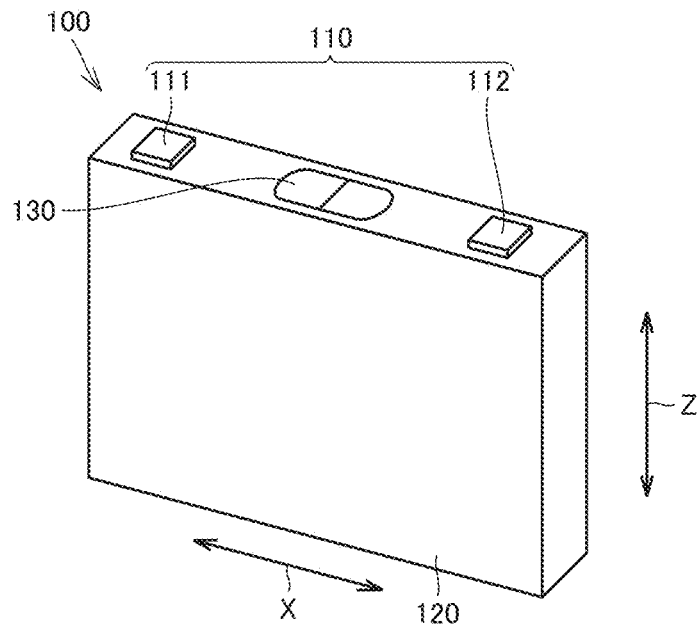
FIG. 3 is a diagram showing a battery cell in the battery pack shown in FIG. 1.

FIG. 3 is a diagram showing battery cell 100 in battery pack 1. As shown in FIG. 3, battery cell 100 includes electrode terminal 110, a housing 120, and a gas discharge valve 130.

Electrode terminal 110 includes a positive electrode terminal 111 and a negative electrode terminal 112. Electrode terminal 110 is formed on housing 120. Housing 120 is formed to have a substantially rectangular parallelepiped shape. An electrode assembly (not shown) and an electrolyte solution (not shown) are accommodated in housing 120. Gas discharge valve 130 is fractured when pressure inside housing 120 becomes equal to or more than a predetermined value. Thus, gas in housing 120 is discharged to the outside of housing 120.

Figure 4:
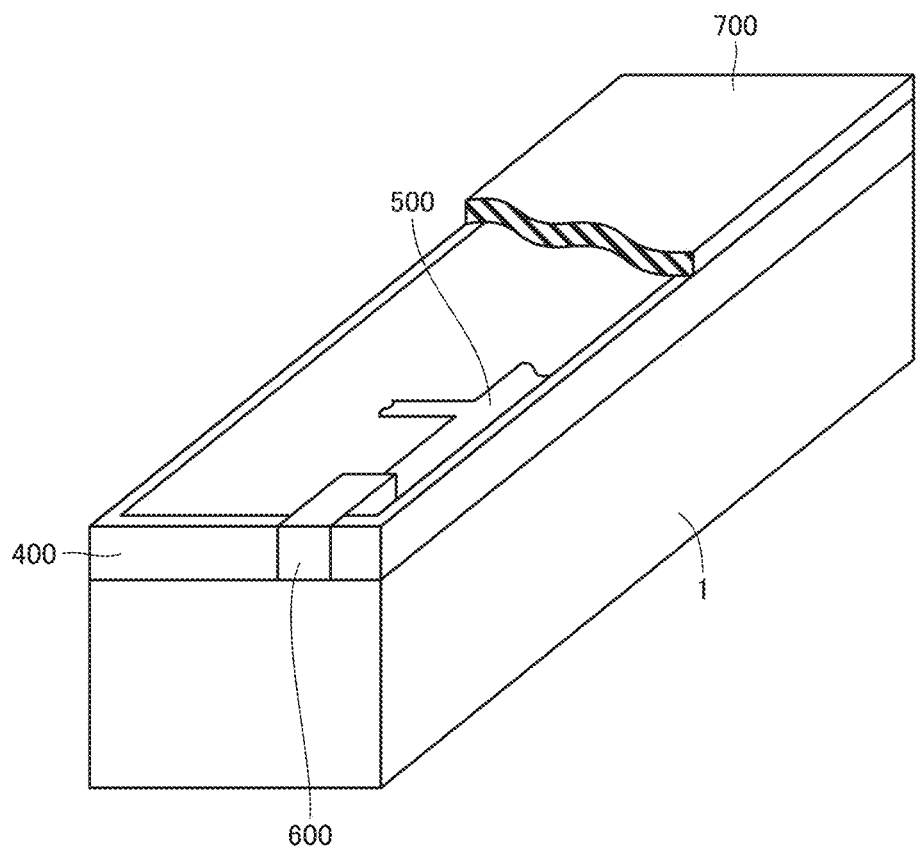
FIG. 4 is a perspective view showing a state in which a wiring module is provided on the battery pack.

FIG. 4 is a perspective view showing a state in which a wiring module is provided on battery pack 1. As shown in FIG. 4, a plate member 400 is placed on battery pack 1, and a wiring member 500 is provided on plate member 400. Wiring member 500 can be electrically connected to an external device via a connector 600. A cover member 700 is provided on plate member 400 so as to cover wiring member 500.

Figure 5:
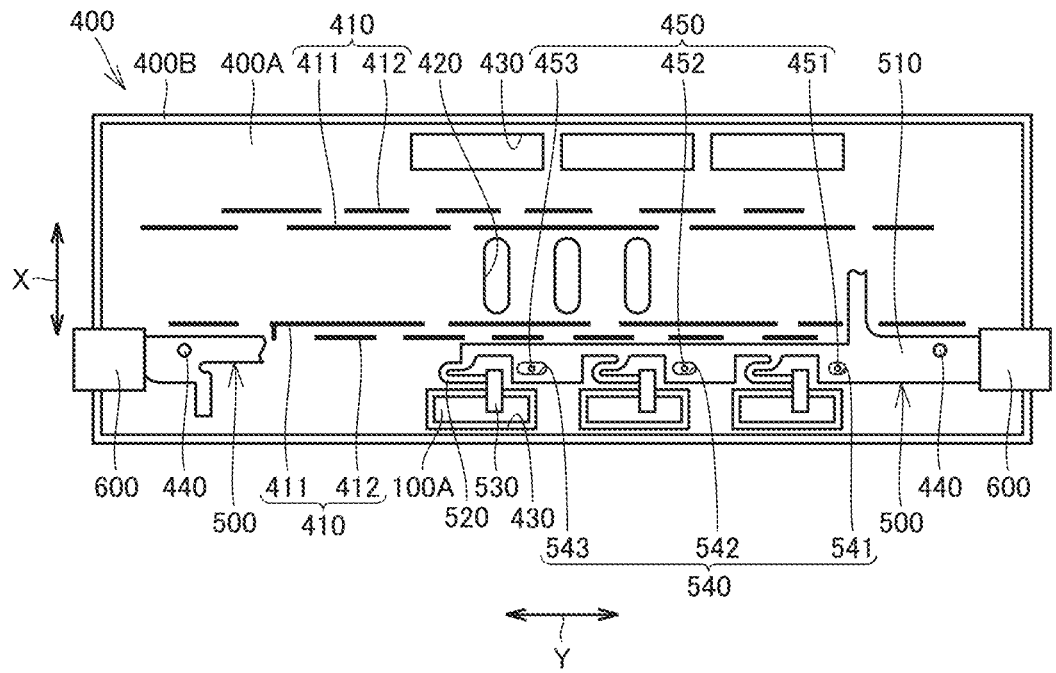
FIG. 5 is a schematic top view of the wiring module placed on the battery pack.

FIG. 5 is a schematic top view of the wiring module placed on battery pack 1. As shown in FIG. 5, the wiring module includes plate member 400, wiring member 500, and connector 600.

Plate member 400 (bus bar plate) is a resin plate having insulation property and heat resistance. Plate member 400 has: a bottom surface portion 400A; and a side surface portion 400B formed to extend upward from bottom surface portion 400A in a Z axis direction.

Plate member 400 is provided with wall portions 410, openings 420, 430, and protrusions 440, 450.

Each of wall portions 410 is formed to extend upward from bottom surface portion 400A of plate member 400 in the Z axis direction. Wall portion 410 includes: a first wall portion 411 formed on the center side in the X axis direction; and a second wall portion 412 provided on the outer side in the X axis direction in parallel with first wall portion 411. Each of first wall portion 411 and second wall portion 412 is formed to extend discontinuously in the Y axis direction.

Each of first wall portion 411 and second wall portion 412 can serve as a protection wall that prevents sparking generated in plate member 400 from being directly exposed to outside while securing a path for discharging, to the outside of the battery pack, the gas discharged from housing 120 of battery cell 100.

Each of openings 420 is located above gas discharge valve 130 of battery cell 100. Each of openings 430 is located above electrode terminal 110 of battery cell 100.

Each of protrusions 440 (projections) extends through wiring member 500 in the vicinity of connector 600. Thus, connector 600 is positioned.

Protrusions 450 include a first protrusion 451, a second protrusion 452, and a third protrusion 453 in the order from the side closest to connector 600. First protrusion 451, second protrusion 452, and third protrusion 453 are formed side by side in the Y axis direction. Each of first protrusion 451, second protrusion 452, and third protrusion 453 extends through wiring member 500. The number of protrusions 450 can be appropriately changed.

Wiring member 500 includes a flexible printed circuit board 510, displacement absorbing portions 520, bus bar joining portions 530, and elongated holes 540.

Flexible printed circuit board 510 is a board in which an electric circuit is formed on a base member including a base film having an insulation property and a conductive metal foil. The base film is composed of, for example, polyimide or the like. The conductive metal foil is composed of, for example, a copper foil or the like. Flexible printed circuit board 510 has flexibility and has such a characteristic that the electric characteristics of flexible printed circuit board 510 are maintained even when deformed.

Each of displacement absorbing portions 520 is formed by forming a portion of flexible printed circuit board 510 into a substantially U-shape so as to facilitate deformation. Displacement absorbing portion 520 is connected to bus bar joining portion 530. Bus bar joining portion 530 is joined to bus bar 100A that couples electrode terminals 110 of the plurality of battery cells 100. Thus, the electric circuit provided on flexible printed circuit board 510 and battery pack 1 are electrically connected to each other. With displacement absorbing portion 520, displacements (in the X axis direction, the Y axis direction, and the Z axis direction) of bus bar joining portion 530 can be absorbed.

Elongated holes 540 include a first elongated hole 541, a second elongated hole 542, and a third elongated hole 543 in the order from the side closest to connector 600. First elongated hole 541, second elongated hole 542, and third elongated hole 543 are formed side by side in the Y axis direction. The number of elongated holes 540 can be appropriately changed.

First protrusion 451 is inserted into first elongated hole 541. Second protrusion 452 is inserted into second elongated hole 542. Third protrusion 453 is inserted into third elongated hole 543. Second elongated hole 542 is longer than first elongated hole 541 in the Y axis direction, and third elongated hole 543 is longer than second elongated hole 542 in the Y axis direction. That is, the lengths of elongated holes 540 in the Y axis direction are longer in the direction further away from connector 600. In this way, positioning can be readily performed when placing wiring member 500 and connector 600 on plate member 400.

Connector 600 is fixed to flexible printed circuit board 510. The electric circuit in flexible printed circuit board 510 and an external electric device can be electrically connected to each other via connector 600.

Figure 6:
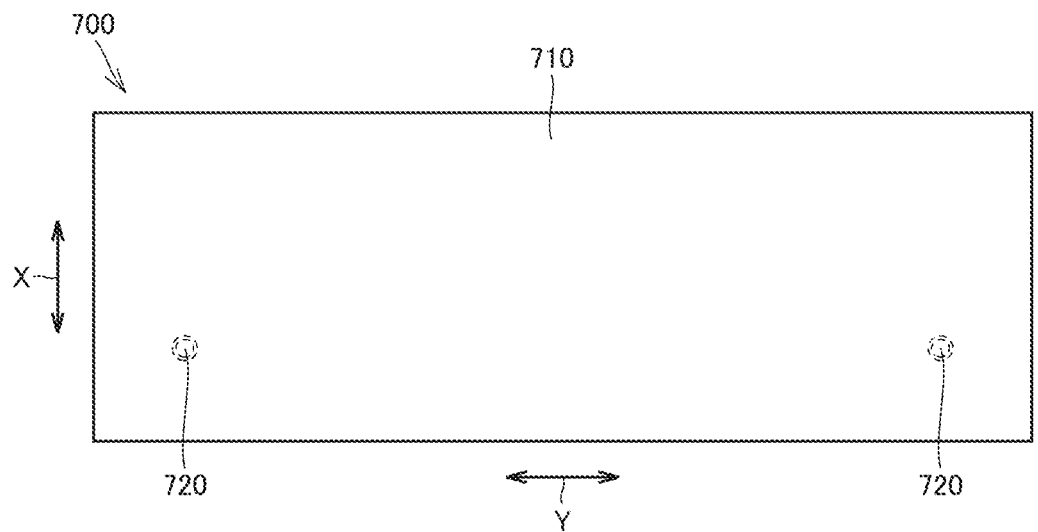
FIG. 6 is a schematic top view of a cover member that covers the wiring module.

FIG. 6 is a schematic top view of cover member 700 (bus bar cover) that covers the wiring module shown in FIG. 5. Cover member 700 is provided on plate member 400 so as to cover flexible printed circuit board 510.

As shown in FIG. 6, cover member 700 includes a main body 710 and tubular protrusions 720. Each of tubular protrusions 720 protrudes toward flexible printed circuit board 510 on plate member 400.

Figure 7:
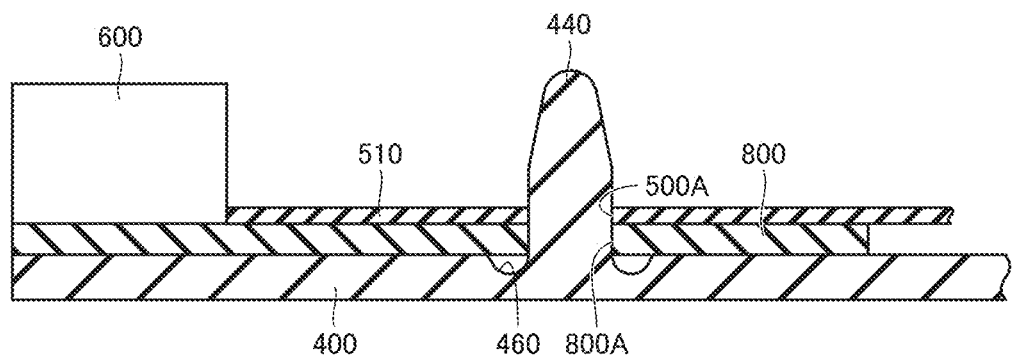
FIG. 7 is a cross sectional view of the vicinity of a connector in the wiring module.

FIG. 7 is a cross sectional view of the vicinity of connector 600 in the wiring module. As shown in FIG. 7, a substrate 800 that supports flexible printed circuit board 510 and connector 600 is provided. Substrate 800 is fixed to plate member 400. Substrate 800 is composed of, for example, a glass epoxy resin or the like. Substrate 800 is composed of a material harder than that of flexible printed circuit board 510.

Protrusion 440 of plate member 400 extends through hole portion 800A of substrate 800 and hole portion 500A of flexible printed circuit board 510. That is, plate member 400 and substrate 800 are engaged with each other by protrusion 440 of plate member 400 and hole portion 800A of substrate 800. Thus, substrate 800 and wiring member 500 can be positioned with respect to plate member 400.

Further, a groove portion 460 having an annular shape is formed in plate member 400 at the root portion of protrusion 440. Groove portion 460 has a curved contour. Accordingly, stress concentration around groove portion 460 can be relaxed.

When protrusion 440 is formed at plate member 400 by resin molding, the root portion of protrusion 440 needs to have a portion having a curved shape (shape with a curvature) for the sake of manufacturing. If the curved shape (shape with a curvature) is provided without forming groove portion 460, the diameter of the root portion of protrusion 440 becomes large, with the result that hole portion 500A of flexible printed circuit board 510 and hole portion 800A of substrate 800 have to be slightly larger. When hole portion 500A of flexible printed circuit board 510 is large, an area in which the electric circuit can be formed in flexible printed circuit board 510 is reduced. When hole portion 800A of substrate 800 is large, precision in positioning connector 600 with substrate 800 being interposed is reduced.

On the other hand, according to the structure of the present embodiment, since groove portion 460 having the curved contour is formed in bottom surface portion 400A of plate member 400 at the root portion of protrusion 440, hole portion 500A of flexible printed circuit board 510 and hole portion 800A of substrate 800 can be suppressed from being large while relaxing stress concentration around groove portion 460. As a result, the area in which the electric circuit can be formed in flexible printed circuit board 510 can be suppressed from being reduced and the precision in positioning connector 600 with substrate 800 being interposed can be suppressed from being reduced. As a result, downsizing of the module as a whole can be attained, and the power storage module in which connector 600 is positioned with high precision can be obtained.

Figure 8:
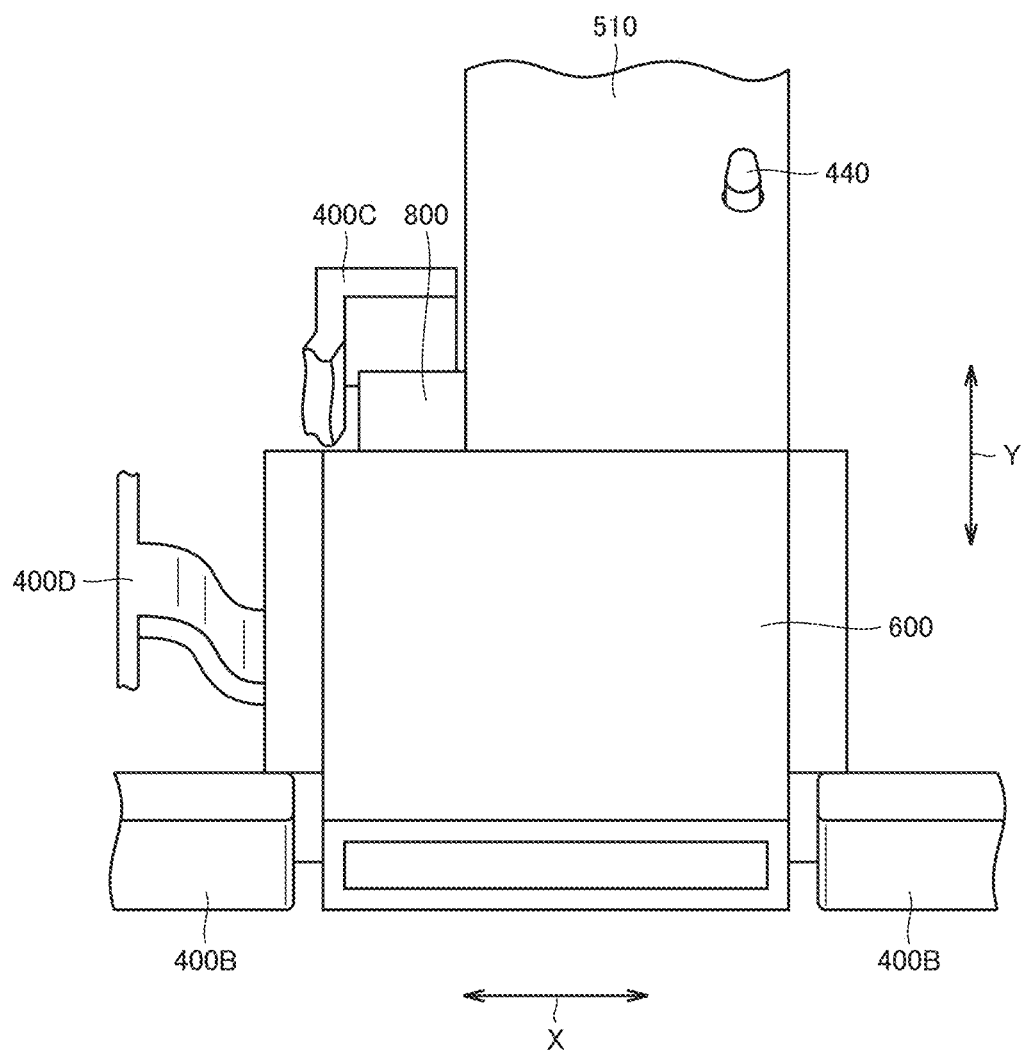
FIG. 8 is a perspective view of the vicinity of the connector in the wiring module.

FIG. 8 is a perspective view of the vicinity of connector 600 in the wiring module. As shown in FIG. 8, protrusion 440 having a perfect circular shape extends through substrate 800 and flexible printed circuit board 510, thereby positioning wiring member 500. Further, substrate 800 is brought into abutment with an inner wall portion 400C of plate member 400, and substrate 800 is positioned also by this abutment.

Further, plate member 400 has a claw portion 400D (restraint portion), and connector 600 is restrained also in the Z axis direction by engaging claw portion 400D with connector 600.

Thus, in the structure according to the present embodiment, the positioning of wiring member 500 is performed by performing positioning of substrate 800 and connector 600, which are harder than flexible printed circuit board 510. Further, substrate 800 is not provided across entire flexible printed circuit board 510, but is provided only in the vicinity of connector 600. Substrate 800 harder than flexible printed circuit board 510 and provided only in the vicinity of connector 600 is readily handled when placing it on plate member 400. Therefore, according to the structure of the present embodiment, the positioning of the wiring member can be performed readily and precisely.

Figure 9:
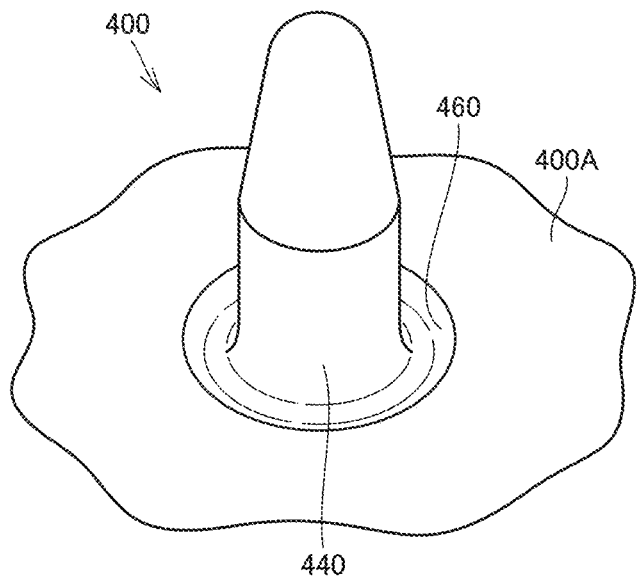
FIG. 9 is a perspective view showing the vicinity of the projection provided in the plate member of the wiring module.
Figure 10:
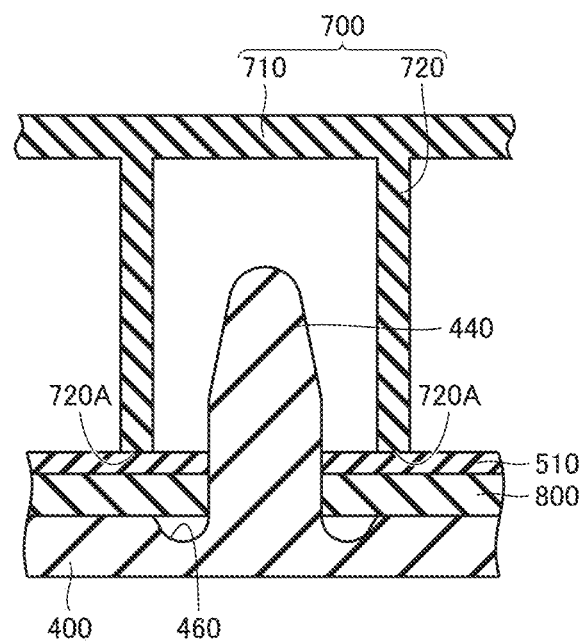
FIG. 10 is a cross sectional view showing a state in which the cover member is attached to the wiring module (the vicinity of the projection shown in FIG. 9).

FIG. 9 is a perspective view showing the vicinity of protrusion 440 of plate member 400. As shown in FIG. 9, groove portion 460 is formed to have an annular shape so as to surround the entire periphery of the root portion of protrusion 440. FIG. 10 is a cross sectional view of the vicinity of protrusion 440 when cover member 700 is attached to the wiring module. As shown in FIG. 10, tubular protrusion 720 of cover member 700 is in abutment with flexible printed circuit board 510. Thus, wiring member 500 and substrate 800 are pressed against plate member 400 and are therefore fixed. On this occasion, protrusion 440 of plate member 400 is accommodated in the inner periphery of tubular protrusion 720. Abutment surface 720A of tubular protrusion 720 is located on the outer peripheral side with respect to groove portion 460 at the root portion of protrusion 440.

The electric circuit in flexible printed circuit board 510 is provided on the outer peripheral side with respect to abutment surface 720A of tubular protrusion 720. Therefore, the electric circuit in flexible printed circuit board 510 can be suppressed from being damaged due to abutment with tubular protrusion 720. When the electric circuit in flexible printed circuit board 510 extends to the inner peripheral side with respect to abutment surface 720A of tubular protrusion 720, a notch may be provided at a portion of the tip of tubular protrusion 720 so as to suppress the electric circuit from being damaged.

Figure 11:
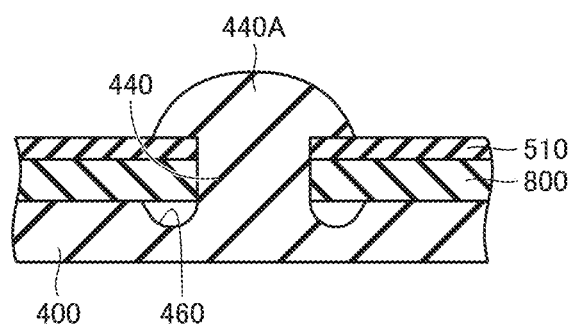
FIG. 11 is a cross sectional view of the vicinity of a projection according to a modification.

FIG. 11 is a cross sectional view of the vicinity of a protrusion 440 according to a modification. In the example shown in FIG. 11, a swaged portion 440A is formed at the tip of protrusion 440. Swaged portion 440A is formed by, for example, heat swaging. Flexible printed circuit board 510 is fixed to plate member 400 by swaged portion 440A. In the example of FIG. 11, tubular protrusion 720 of cover member 700 is not necessarily required.

Figure 12:
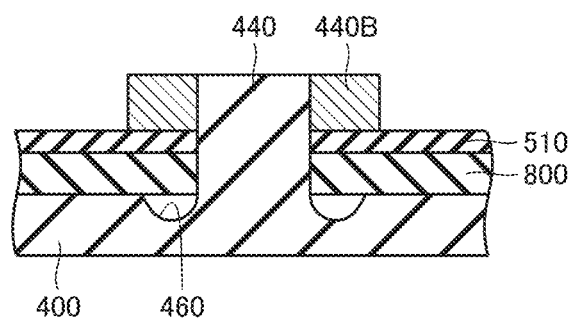
FIG. 12 is a cross sectional view of the vicinity of a projection according to another modification.

FIG. 12 is a cross sectional view of the vicinity of a protrusion 440 according to another modification. In the example shown in FIG. 12, a fixation member 440B is provided on the outer peripheral portion of protrusion 440. Fixation member 440B fixes flexible printed circuit board 510 to plate member 400. Also in the example of FIG. 12, tubular protrusion 720 of cover member 700 is not necessarily required.

Although the embodiments of the present invention have been described and illustrated in detail, it is clearly understood that the same is by way of illustration and example only and is not to be taken by way of limitation, the scope of the present invention being interpreted by the terms of the appended claims.

What is claimed is:

1. A power storage module, comprising:
    a stack in which a plurality of power storage cells are stacked in a stacking direction;
    a resin plate having a bottom surface portion and placed on the stack of the plurality of power storage cells;
    a flexible printed circuit board placed on the bottom surface portion of the resin plate and having an electric circuit electrically connected to the plurality of power storage cells;
    a connector for the electric circuit, the connector being fixed to the flexible printed circuit board; and
    a substrate that supports the flexible printed circuit board and the connector, the substrate being fixed to the resin plate with the substrate being positioned in an extending direction of the bottom surface portion of the resin plate,
    the resin plate has a first protrusion and a second protrusion each extending upward from the bottom surface portion, the first protrusion and the second protrusion being provided side by side in the stacking direction,
    the flexible printed circuit board is provided with a first hole portion and a second hole portion through which the first protrusion and the second protrusion respectively extend,
    the second protrusion and the second hole portion are provided at positions further away from the connector with respect to the first protrusion and the first hole portion respectively,
    a hole diameter of the second hole portion along the stacking direction is larger than a hole diameter of the first hole portion along the stacking direction,
    the first protrusion and the second protrusion have a substantially same diameter along the stacking direction,
    the hole diameter of the first hole portion along the stacking direction is substantially larger than the diameter of the first protrusion along the stacking direction, and
    the hole diameter of the second hole portion along the stacking direction is substantially larger than the diameter of the second protrusion along the stacking direction.

2. The power storage module according to claim 1, further comprising an engagement portion that engages the resin plate and the substrate with each other.

3. The power storage module according to claim 2, wherein the resin plate has a third protrusion different from the first protrusion and the second protrusion, the substrate is provided with a hole portion, and the engagement portion is formed by the third protrusion and the hole portion.

4. The power storage module according to claim 3, wherein
    the flexible printed circuit board further includes a hole portion different from the first hole portion and the second hole portion, and
    the third protrusion extends through the hole portion of the substrate and the hole portion of the flexible printed circuit board.

5. The power storage module according to claim 4, wherein
    the resin plate includes a groove portion having an annular shape in the bottom surface portion at a root portion of the third protrusion.

6. The power storage module according to claim 5, wherein
    the groove portion has a curved contour.

7. The power storage module according to claim 5, further comprising a cover member including a tubular protrusion in abutment with the flexible printed circuit board,
    wherein
    the third protrusion of the resin plate is accommodated in the tubular protrusion, and
    an abutment surface of the tubular protrusion is located on an outer side of the groove portion.

8. The power storage module according to claim 1, wherein the resin plate includes a restraint portion that restrains the connector along a direction orthogonal to the extending direction of the bottom surface portion.

9. A method of manufacturing a power storage module, the method comprising:
    forming a stack by stacking a plurality of power storage cells in a stacking direction;
    placing a resin plate on the stack of the plurality of power storage cells, the resin plate having a bottom surface portion; and
    placing a wiring member on the bottom surface portion of the resin plate, the wiring member including a flexible printed circuit board having an electric circuit, wherein
    the placing of the wiring member on the bottom surface portion of the resin plate includes
        fixing, to the flexible printed circuit board, a connector for the electric circuit,
        assembling a substrate to the flexible printed circuit board and the connector, and
        fixing the substrate to the resin plate, while positioning the substrate in an extending direction of the bottom surface portion,
    the placing of the wiring member on the bottom surface portion of the resin plate includes
        inserting a first protrusion into a first hole portion of the flexible printed circuit board, and
        inserting a second protrusion into a second hole portion of the flexible printed circuit board,
    the first protrusion extending upward from the bottom surface portion of the resin plate, the second protrusion extending upward from the bottom surface portion of the resin plate at a position further away from the connector with respect to the first protrusion,
    a hole diameter of the second hole portion along the stacking direction is larger than a hole diameter of the first hole portion along the stacking direction,
    the first protrusion and the second protrusion have a substantially same diameter along the stacking direction,
    the hole diameter of the first hole portion along the stacking direction is substantially larger than the diameter of the first protrusion along the stacking direction, and
    the hole diameter of the second hole portion along the stacking direction is substantially larger than the diameter of the second protrusion along the stacking direction.

10. The method according to claim 9, wherein the positioning in the extending direction of the bottom surface portion by engaging the resin plate and the substrate with each other.

11. The method according to claim 10, wherein the positioning in the extending direction of the bottom surface portion is performed by engaging a third protrusion formed in the resin plate with a hole portion formed in the substrate, the third protrusion being different from the first protrusion and the second protrusion.

12. The method according to claim 11, wherein
the positioning in the extending direction of the bottom surface portion is further performed by inserting the third protrusion formed in the resin plate into a hole portion formed in the flexible printed circuit board, the hole portion formed in the flexible printed circuit board being different from the first hole portion and the second hole portion.

13. The method according to claim 11, wherein
the resin plate includes a groove portion having an annular shape formed in the bottom surface portion at a root portion of the third protrusion.

14. The method according to claim 13, wherein the groove portion has a curved contour.

15. The method according to claim 13, further comprising placing a cover member to the wiring member, wherein
the cover member includes a tubular protrusion in abutment with the flexible printed circuit board,
the third protrusion formed in the resin plate is accommodated in the tubular protrusion, and
an abutment surface of the tubular protrusion is located on an outer side of the groove portion.

16. The method according to claim 9, further comprising restraining the connector to the resin plate along a direction orthogonal to the extending direction of the bottom surface portion.

* * * * *